(12) United States Patent
Park et al.

(10) Patent No.: US 9,633,915 B1
(45) Date of Patent: Apr. 25, 2017

(54) METHOD OF USING DUMMY PATTERNS FOR OVERLAY TARGET DESIGN AND OVERLAY CONTROL

(71) Applicant: GLOBALFOUNDRIES Inc., Grand Cayman (KY)

(72) Inventors: Dongsuk Park, Mechanicville, NY (US); Yue Zhou, Clifton Park, NY (US); Mert Karakoy, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/057,727

(22) Filed: Mar. 1, 2016

(51) Int. Cl.
*H01L 21/66* (2006.01)
*H01J 37/28* (2006.01)
*G01B 15/00* (2006.01)

(52) U.S. Cl.
CPC .............. *H01L 22/20* (2013.01); *G01B 15/00* (2013.01); *H01J 37/28* (2013.01)

(58) Field of Classification Search
USPC ............................... 250/310, 307, 306, 492.2
See application file for complete search history.

(56) References Cited

U.S. PATENT DOCUMENTS

| 8,010,207 B2 | 8/2011 | Smits et al. |
| 2015/0115465 A1* | 4/2015 | Lin ...................... H01L 21/568 257/774 |

OTHER PUBLICATIONS

Inoue et al., "In-die Overlay Metrology by using CD-SEM", Proceedings of SPIE, Apr. 10, 2013, vol. 8681, pp. 36812S-1-86812S-9.

* cited by examiner

*Primary Examiner* — Kiet T Nguyen
(74) *Attorney, Agent, or Firm* — Ditthavong & Steiner, P.C.

(57) ABSTRACT

Methodologies for using dummy patterns for overlay target design and overlay control are provided. Embodiments include providing a first dummy pattern on a first layer as an outer overlay target for an integrated circuit (IC); providing a pattern associated with a second dummy pattern on a second layer as a target for measuring overlay; and utilizing a scanning electron microscope (SEM) to obtain an overlay measurement between the first and second dummy patterns.

20 Claims, 6 Drawing Sheets

METHOD OF USING DUMMY PATTERNS FOR OVERLAY TARGET DESIGN AND OVERLAY CONTROL

TECHNICAL FIELD

The present disclosure relates to overlay target design and overlay control. In particular, the present disclosure relates to overlay target metrology for semiconductor devices in the nanometer (nm) technology nodes.

BACKGROUND

Silicon wafers are manufactured in sequential steps, each stage placing a pattern of material on the wafer; in this way transistors, contacts, etc., all made of different materials, are laid down. In order for the final device to function correctly, these separate patterns must be aligned correctly—for example contacts, lines and transistors must all line up. Overlay control defines the control of this pattern-to-pattern alignment. It has always played an important role in integrated circuit (IC) manufacturing, helping to monitor layer-to-layer alignment on multi-layer device structures. Misalignment of any kind can cause short circuits and connection failures, which in turn impact fab yield and profit margins. Overlay control has become even more critical now because the combination of increasing pattern density and innovative techniques, such as double patterning and immersion lithography, creates pattern-based yield challenges. Overlay metrology solutions with both higher measurement accuracy/precision and process robustness are key factors when addressing increasingly tighter overlay budgets. Higher order overlay control and in-field metrology using smaller, micro-grating or other novel targets are becoming essential for successful production ramps and higher yields.

The more semiconductor design rules shrink, it is considered that overlay error budget percentage increases compared to the product overlay budget. Even a small amount of overlay improvement is desired, but there are no conventional methods to provide overlay measurement with proper target design that is very small and easily distributed across an entirety of the chip.

A need therefore exists for methodology that provides overlay target design that can be detected and distributed across an entirety of the chip during processing of a semiconductor device.

SUMMARY

One aspect of the present disclosure is a method for using an image based overlay target that is of sufficient size to be measured by measurement tools to determine if misalignment is present, does not create defects by various processes, and is distributable across the entire wafer without limitation.

Other aspects of the present disclosure include extending the methodology to any required process tool parameter that can be converted, such as detecting and controlling localized stress, hot spots, heat budgets, etc.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a first dummy pattern on a first layer as an outer overlay target for an IC; providing an pattern associated with a second dummy pattern on a second layer as a target for measuring overlay; and utilizing a scanning electron microscope (SEM) to obtain an overlay measurement between the first and second dummy patterns.

Aspects of the present disclosure include the first layer being formed over a substrate. Some aspects include the substrate being a reticle. Other aspects include the substrate being a wafer. Certain aspects include the overlay measurement extending across an entirety of the wafer. Further aspects include comparing the overlay measurement to information about the IC stored in a database. Yet further aspects include adjusting a lithography process of the IC on the first and second layers based on a difference between the overlay measurement and the information about the IC stored in the database. Other aspects include the information about the IC including layer thickness, layer stress, optical OVL, or other measurement outputs. Additional aspects include determining a process tool parameter based on the overlay measurement, the process tool parameter selected from localized stress, hot spot or heat budget.

Another aspect of the present disclosure is a method including: providing a first dummy pattern on a first layer as a first overlay target for an IC; providing a second dummy pattern on a second layer as a second overlay target; and utilizing a SEM to obtain an overlay measurement between the first and second dummy patterns, wherein the first and second layers are used as patterning layers.

Aspects of the present disclosure include the first and second layers are used as multi patterning layers. Other aspects include comparing the overlay measurement to information about the IC stored in a database. Yet further aspects include adjusting a lithography process of the IC on the first and second layers based on a difference between the overlay measurement and the information about the IC stored in the database. Additional aspects include the information about the IC including layer thickness, layer stress, optical OVL, or other measurement outputs. Some aspects include the first layer being formed over a substrate. Other aspects include the substrate being a reticle or substrate. Further aspects include determining a process tool parameter based on the overlay measurement, the process tool parameter being selected from localized stress, hot spot or heat budget. Still further aspects include providing a third dummy pattern on a third layer as a third overlay target; and utilizing the SEM to obtain the overlay measurement between the first, second and third dummy patterns.

Yet another aspect of the present disclosure is a method including providing a first dummy pattern on a first layer as a first overlay target for an IC, the first layer formed over a substrate; providing a second dummy pattern on a second layer as a second overlay target; utilizing a SEM to obtain an overlay measurement between the first and second dummy patterns; comparing the overlay measurement to information about the IC stored in a database; and adjusting a lithography process of the IC on the first and second layers based on a difference between the overlay measurement and the information about the IC stored in the database, wherein the first and second layers are used as multi patterning layers.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

Figure 1:
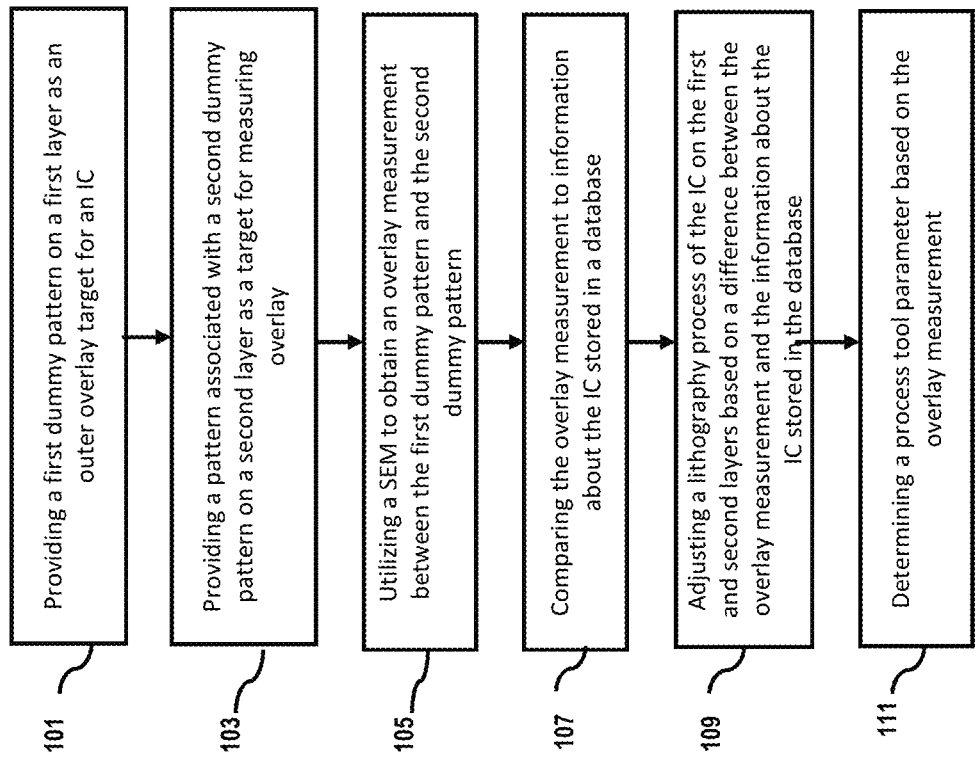
FIG. 1 illustrates an overlay target process flow chart, according to an exemplary embodiment.

FIG. 1 illustrates a process flow in accordance with an exemplary embodiment. In Step 101 a first dummy pattern is provided on a first layer. The first layer is formed over a substrate such as a reticle or wafer. The first dummy pattern serves as an outer overlay target for an IC. In Step 103, a pattern is provided and is associated with a second dummy pattern on a second layer and serves as a target for measuring overlay. In Step 105, a SEM is used to obtain an overlay measurement between the first and second dummy patterns. In Step 107, the overlay measurement from the SEM scan is compared against information about the IC that is stored in a database. Non-limiting examples of information stored in the database include layer thickness, layer stress, optical OVL and other measurement outputs. In Step 109, a lithography process of the IC is adjusted on the first and second layers based on a difference between the overlay measurement and the information about the IC stored in the database. The overlay measurement of the present embodiment can extend across the entirety of the wafer or reticle field. In certain embodiments, a process tool parameter based on the overlay measurement can be determined (Step 111). The process tool parameter can include, but not limited to, localized stress, hot spot or heat budget.

Figure 2:
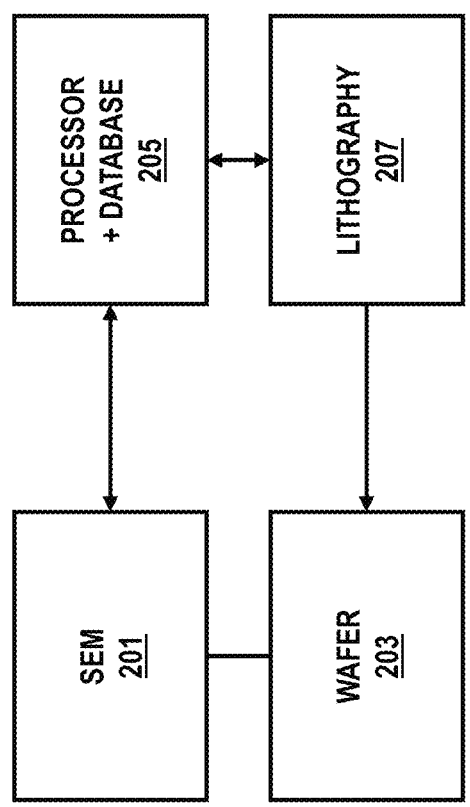
FIG. 2 schematically illustrates a system for performing an overlay target process, in accordance with an exemplary embodiment.

Adverting to FIG. 2, a system which can be utilized to measure and control the overlay alignment in accordance with an exemplary embodiment. The system includes a SEM 201 which is configured to measure the overlay during processing of a wafer 203 having an IC formed thereon. The SEM 201 provides the overlay measurement information to a processor system 205 which includes or is associated with a database. The overlay measurement from the SEM 201 scan is compared against design data information about the wafer 203 that is stored in the database. A lithography process 207 of the wafer 203 is controlled and adjusted in order to minimize the overlay misalignment. As discussed above, a lithography process can be performed on the first and second layers based on a difference between the overlay measurement and the information about the wafer stored in the database.

The processes described herein may be implemented via software, hardware, firmware, or a combination thereof. A computer system includes at least one processor (i.e. 205), at least one memory, and at least one storage. The memory may, for instance, include dynamic storage, static storage, or a combination thereof. The computer system may be coupled a to display and one or more input devices, such as a keyboard and a pointing device. The display may be utilized to provide one or more GUI interfaces. The computer system is equipped with a graphics card. Input devices may be utilized by users of the computer system to interact with, for instance, the GUI interfaces. Storage may store applications, layout data (or information), mask design rules, and a pattern database (or repository). Applications may include instructions (or computer program code) that when executed by the processor cause the computer system to perform one or more processes, such as one or more of the processes described herein. It is noted that, in various aspects, some or all of the techniques described herein are performed by the computer system in response to the processor executing one or more sequences of one or more processor instructions contained in memory. Such instructions, also called computer instructions, software and program code, may be read into memory from another computer-readable medium such as a storage device or a network link. Execution of the sequences of instructions contained in memory causes the processor to perform one or more of the method steps described herein. Embodiments of the invention are not limited to any specific combination of hardware and software, unless otherwise explicitly stated herein.

Figure 3:
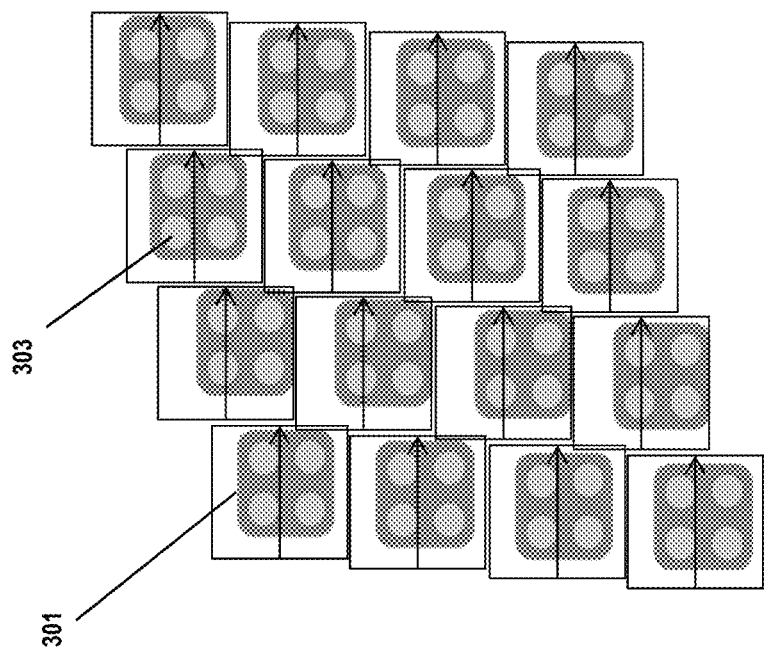
FIG. 3 illustrates an overlay target design, according to an exemplary embodiment.

Adverting to FIG. 3, a dummy pattern 301 is represented as an overlay target for anchor structure 303. Since most semiconductor reticles are filled with a dummy pattern which is required to control a reticle transmission factor, and to ensure dry etch and chemical mechanical polishing (CMP) processes which have the same loading effect regardless of the product used. In this example a dummy design rule is used to create a first layer as an outer overlay target (i.e. dummy pattern 301). The dummy pattern 301 requires the anchor structure 303 to ensure the dummy pattern is not lifting. In this embodiment, by using the anchor structure 303 as a second target, an overlay measurement can be accurately recorded.

Figure 4:
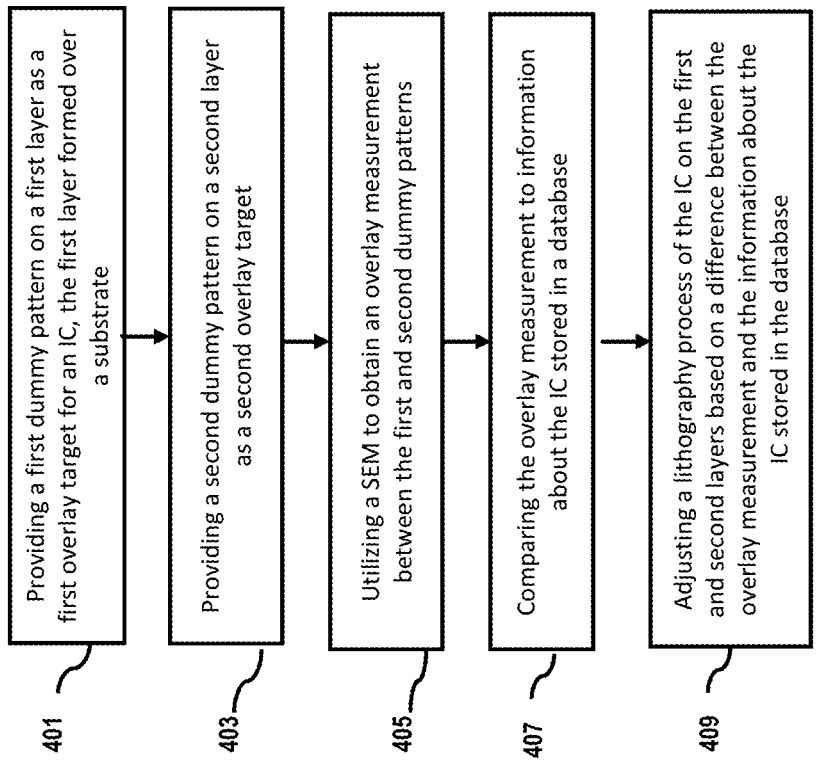
FIG. 4 illustrates an overlay target process flow chart, according to another exemplary embodiment.

FIG. 4 illustrates a process flow as part of a double patterning process, in accordance with another exemplary embodiment. In Step 401, a first dummy pattern is provided on a first of two double patterning layers as a first overlay target for an IC. The first layer formed over a substrate. In Step 403, a second dummy pattern is formed on a second of the two double patterning layers as a second overlay target. In Step 405, a SEM is utilized to obtain an overlay measurement between the first and second dummy patterns. In Step 407, the overlay measurement is compared to information about the IC stored in a database. In Step 409, a lithography process of the IC can be adjusted on the first and second layers based on a difference between the overlay measurement and the information about the IC stored in the database.

Figure 5:
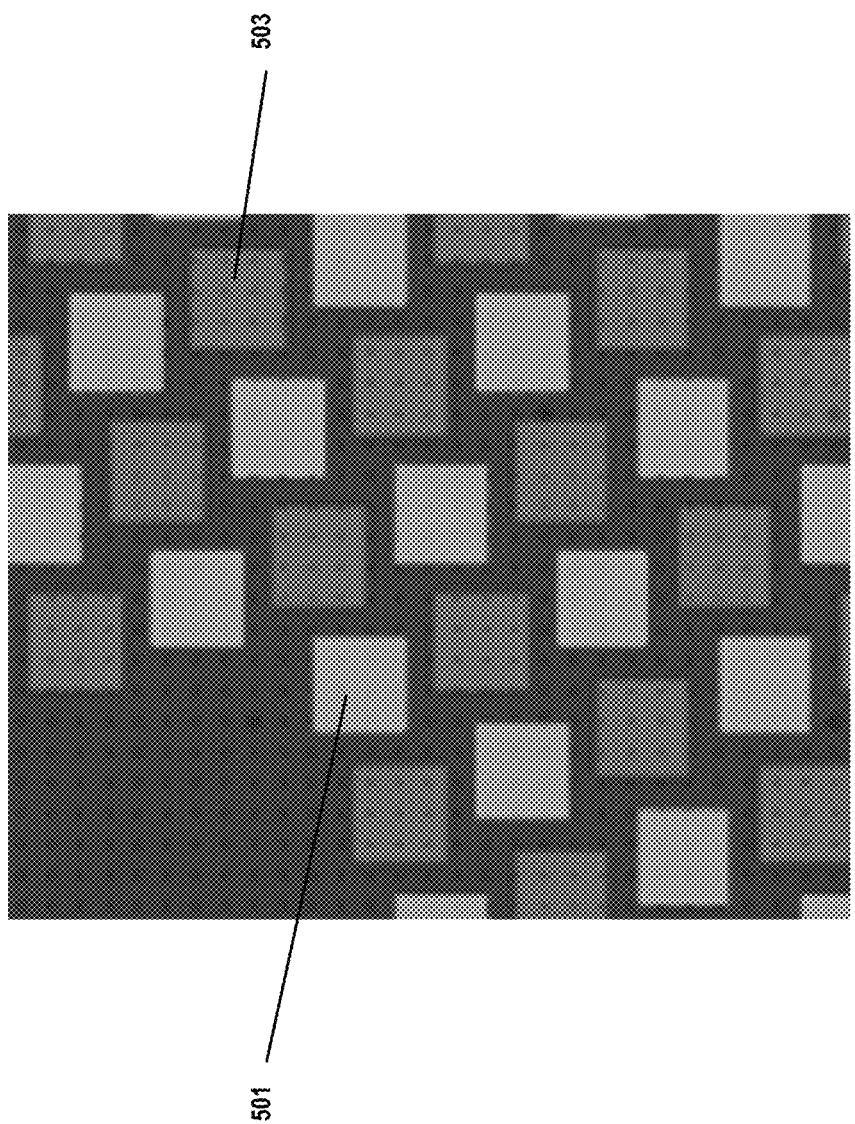
FIG. 5 illustrates an overlay target design, according to another exemplary embodiment.

Adverting to FIG. 5, an example of first and second layers used as double patterning layers. When this double patterning process is used, the dummy patterns 501 and 503 can be separated into two different colors or contrasting tones in or by a database file format such as a GDS file format. Dummy patterns 501 and 503 are provided on separate layers. The distance between the dummy patterns 501 and 503 or the distance between their centers of gravities can be measured by the SEM and used as an overlay measurement. In addition, for higher density overlay measurements, a third dummy pattern may be formed on a third layer and used as a third overlay target and the SEM can obtain the overlay measurement between the first, second and third dummy patterns.

Figure 6:
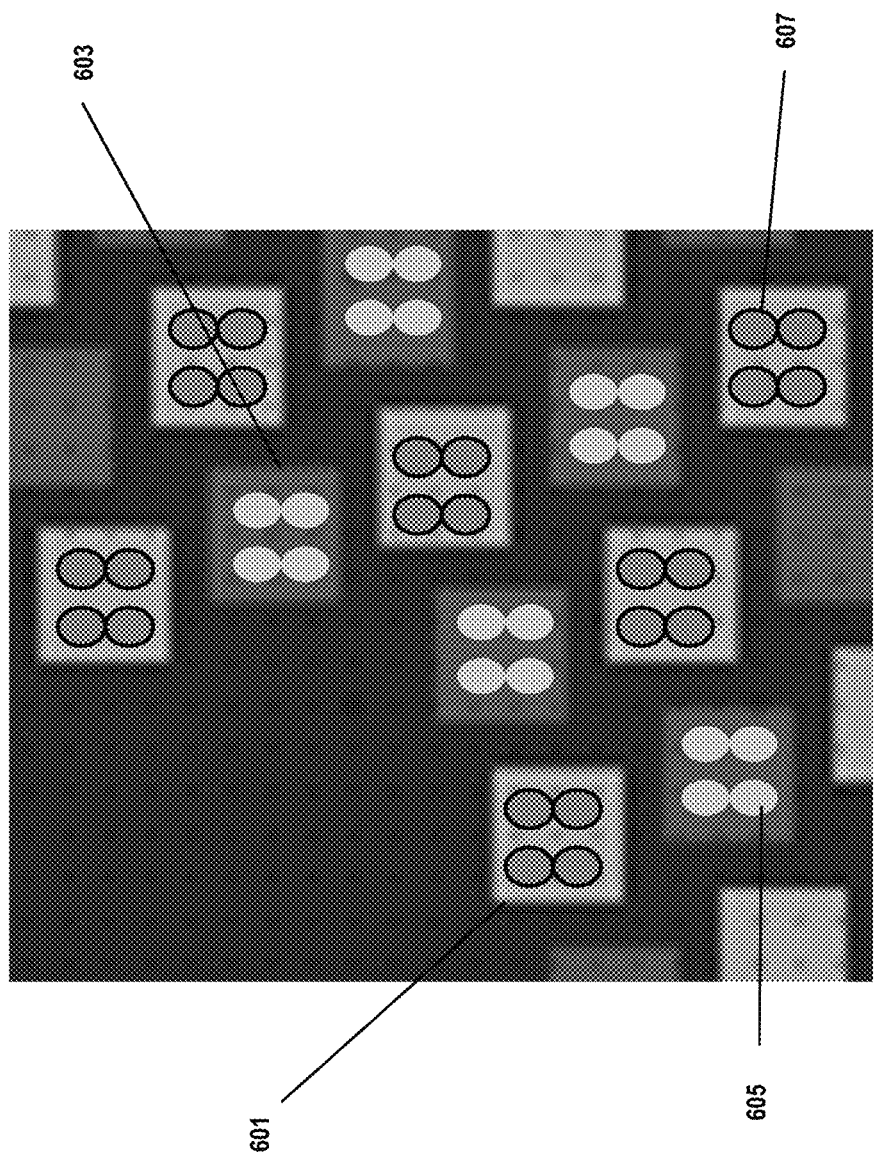
FIG. 6 illustrates an overlay target design, according to yet another exemplary embodiment.

With the present methodology, the dummy patterns can be used as a new target in higher density overlay measurements. The dummy patterns, which have only been used as a fill material, are converted into metrology targets including, but not limited to thickness and OCD. The dummy patterns can be used as multi-overlay targets. Depending on the point in the semiconductor process flow, it is possible to obtain information from multiple layers. Adverting to FIG. 6, in this example, up to four layers (601, 602, 603, and 604) can be visualized with different colors or contrasting tones in or by a database file format such as a GDS file format.

The embodiments of the present disclosure can achieve several technical effects including accurate reading and confidence in any given location on a wafer without requiring an additional target design. The methods described herein provide closer location to traditional overlay targets without limitation, are distributed across the reticle field without creating defects, and can be extended easily to future generations. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly in the nm technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a first dummy pattern on a first layer as an outer overlay target for an integrated circuit (IC);
providing a pattern associated with a second dummy pattern on a second layer as a target for measuring overlay; and
utilizing a scanning electron microscope (SEM) to obtain an overlay measurement between the first and second dummy patterns.

2. The method according to claim 1, wherein the first layer is formed over a substrate.

3. The method according to claim 2, wherein the substrate is a reticle.

4. The method according to claim 3, wherein the overlay measurement extends across an entirety of the reticle.

5. The method according to claim 2, wherein the substrate is a wafer.

6. The method according to claim 5, wherein the overlay measurement extends across an entirety of the wafer.

7. The method according to claim 1, further comprising:
comparing the overlay measurement to information about the IC stored in a database.

8. The method according to claim 7, further comprising:
adjusting a lithography process of the IC on the first and second layers based on a difference between the overlay measurement and the information about the IC stored in the database.

9. The method according to claim 8, wherein the information about the IC includes layer thickness, layer stress, optical OVL, or other measurement outputs.

10. The method according to claim 1, further comprising:
determining a process tool parameter based on the overlay measurement, the process tool parameter selected from localized stress, hot spot or heat budget.

11. A method comprising:
providing a first dummy pattern on a first layer as a first overlay target for an integrated circuit (IC);
providing a second dummy pattern on a second layer as a second overlay target; and
utilizing a scanning electron microscope (SEM) to obtain an overlay measurement between the first and second dummy patterns,
wherein the first and second layers are used as patterning layers.

12. The method according to claim 11, wherein the first and second layers are used as multi patterning layers.

13. The method according to claim 11, further comprising:
comparing the overlay measurement to information about the IC stored in a database.

14. The method according to claim 13, further comprising:
adjusting a lithography process of the IC on the first and second layers based on a difference between the overlay measurement and the information about the IC stored in the database.

15. The method according to claim 14, wherein the information about the IC includes layer thickness, layer stress, optical OVL, or other measurement outputs.

16. The method according to claim 11, wherein the first layer is formed over a substrate.

17. The method according to claim 16, wherein the substrate is a reticle or substrate.

18. The method according to claim 11, further comprising:
determining a process tool parameter based on the overlay measurement, the process tool parameter selected from localized stress, hot spot or heat budget.

19. The method according to claim 11, further comprising:
providing a third dummy pattern on a third layer as a third overlay target; and utilizing the SEM to obtain the overlay measurement between the first, second and third dummy patterns.

20. A method comprising:

providing a first dummy pattern on a first layer as a first overlay target for an integrated circuit (IC), the first layer formed over a substrate;

providing a second dummy pattern on a second layer as a second overlay target;

utilizing a scanning electron microscope (SEM) to obtain an overlay measurement between the first and second dummy patterns;

comparing the overlay measurement to information about the IC stored in a database; and adjusting a lithography process of the IC on the first and second layers based on a difference between the overlay measurement and the information about the IC stored in the database, wherein the first and second layers are used as multi patterning layers.

* * * * *